(12) United States Patent
Betts et al.

(10) Patent No.: US 9,632,122 B2
(45) Date of Patent: Apr. 25, 2017

(54) DETERMINING OPERATING CHARACTERISTICS OF SIGNAL GENERATOR USING MEASURING DEVICE

(71) Applicant: Keysight Technologies, Inc., Minneapolis, MN (US)

(72) Inventors: Loren C. Betts, Rohnert Park, CA (US); David V. Blackham, Santa Rosa, CA (US); Michael C. Dobbert, Santa Rosa, CA (US); Xiaolong Li, Petaluma, CA (US); Dara Sariaslani, Santa Rosa, CA (US); Lisa Shenton, Santa Rosa, CA (US); Erwin F. Siegel, Windsor, CA (US); Bernadette Smith, Santa Rosa, CA (US); Matt Todhunter, Santa Rosa, CA (US); Kenneth H. Wong, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 123 days.

(21) Appl. No.: 14/312,417

(22) Filed: Jun. 23, 2014

(65) Prior Publication Data

US 2015/0369849 A1    Dec. 24, 2015

(51) Int. Cl.
*G01R 27/28* (2006.01)
*G01R 27/06* (2006.01)
(Continued)

(52) U.S. Cl.
CPC ............. *G01R 27/06* (2013.01); *G01R 27/32* (2013.01); *G01R 31/2822* (2013.01)

(58) Field of Classification Search
None
See application file for complete search history.

(56) References Cited

U.S. PATENT DOCUMENTS 7,486,067 B2    2/2009  Bossche
7,671,605 B2    3/2010  Gunyan et al.
(Continued)

FOREIGN PATENT DOCUMENTS

CN    101452067 A    6/2009
JP    2008151652 A    7/2008

OTHER PUBLICATIONS

Ken Wong, "Signal Generator Source Match Measurement Using a Known Coupler and a VNA with External Phase Lock", Agilent Technologies, Mar. 17, 2014, pp. 1-2.

*Primary Examiner* — Jermele M Hollington
*Assistant Examiner* — Douglas X Rodriguez (57) ABSTRACT

A method determines operating characteristics of a signal generator. The method includes performing a first set of measurements of an output signal generated by the signal generator and corresponding reflected signal, where the first set of measurements is performed over multiple frequencies and amplitudes of the output signal; applying an external signal to the output port of the signal generator; performing a second set of measurements of the output signal and corresponding reflected signal while the external signal is being applied to the output port, where the second set of measurements is performed over frequencies and amplitudes of the output signal, the external signal having the same frequency as the output signal for each measurement of the second set of measurements. A set of coefficients describing the operating characteristics of the signal generator is determined by processing results of the first and second sets of measurements through a non-linear model.

20 Claims, 3 Drawing Sheets

(51) Int. Cl.
*G01R 27/32* (2006.01)
*G01R 31/28* (2006.01)

(56) References Cited

U.S. PATENT DOCUMENTS

| | | |
|---|---|---|
| 8,076,947 B2 | 12/2011 | Nakayama et al. |
| 2009/0216468 A1* | 8/2009 | Anderson .............. G01R 23/20 |
| | | 702/57 |
| 2011/0025296 A1* | 2/2011 | Benedikt ............ G01R 31/2837 |
| | | 324/76.19 |
| 2012/0153933 A1* | 6/2012 | Wong ..................... G01R 23/20 |
| | | 324/76.77 |

* cited by examiner

DETERMINING OPERATING CHARACTERISTICS OF SIGNAL GENERATOR USING MEASURING DEVICE

BACKGROUND

A number of current techniques are employed to measure various characteristic of a signal generator (or device under test (DUT)) for testing and analysis purposes. The current techniques involve generating signal generator characteristics using linear measurements and models only, and therefore provide no non-linear describing behavior, even though signal generators contain active components, such as amplifiers, that exhibit non-linear behavior.

Typically, measurements performed on signal generators involve use of a power sensor and vector network analyzer (VNA) configuration. The power sensor is used to measure output signal characteristics of the signal generator (or device under test (DUT)), and the VNA is used to measure output impedance of the signal generator. However, there are a number of disadvantages of this approach. For example, the VNA is used to measure impedance match of the output port(s) of the signal generator only when the signal generator is not generating an output signal, resulting in output impedance measurement constraint. The impedance of the output port(s) of the signal generator is typically different when comparing a signal "on" state versus a signal "off" state. The more accurate measurement is obtained when the signal generator is "on" and generating a signal, but such a measurement is not possible with the standard VNA approach. Also, power sensors are broadband receivers, so any non-linear distortion (such as harmonics) of the output signal is measured by the power sensor in combination with the fundamental signal. Components of the fundamental frequency and components of the distortion cannot be distinguished from each other, resulting in errors in measured results when trying to measure a signal at a desired fundamental frequency. In addition, the dynamic range the power sensor is low compared to a VNA tuned-receiver, the power sensor impedance is imperfect (e.g., 50 ohms), thus affecting performance of the signal generator when connected, and the power sensor provides amplitude but no phase information. The power sensor also has low linearity compared to the VNA tuned-receiver.

In another conventional approach using a linear model, a VNA utilizes offset frequency hot-match measurements, where the VNA measures amplitude and phase of the output signal from the signal generator, as well as a "hot" S-parameter to determine output impedance of the signal generator. However, according to this approach, a signal source and receivers of the VNA are offset in frequency relative to the signal generator, thus constraining the output impedance measurement. This is because an error corrected S-parameter impedance match measurement is made on the signal generator while the signal generator is generating an output signal, and the offset in frequency enables the ability to distinguish between the signal generated by the signal generator and the signal generated by the VNA signal source. Ideally, the signal generator characteristics should be identified at the same frequency of the generated signal, and not offset in frequency, which introduces errors in the measured results. Another limitation is that this approach assumes a linear model and therefore describes only the linear behavior of the signal generator.

In yet another conventional approach, a VNA implements a coupler and open/short ripple technique. Again, this uses a linear model, and thus no non-linear describing behaving is obtained. Also, there is high uncertainty, as the technique relies on the assumption that the signal generator operation is not influenced by high reflected signals. Also, a power sensor is required for measurements of amplitude (or power), as discussed above.

Accordingly, the current linear methodologies are insufficient, and a non-linear measurement and modeling approach is needed.

SUMMARY

In a representative embodiment, a method is provided for determining operating characteristics of a signal generator by a measuring device. The method includes performing a first set of measurements of an output signal generated by the signal generator and a corresponding reflected signal at an output port of the signal generator, where the first set of measurements is performed over multiple frequencies and multiple amplitudes of the output signal; applying an external signal to the output port of the signal generator; performing a second set of measurements of the output signal and the corresponding reflected signal at the output port of the signal generator while the external signal is being applied to the output port, where the second set of measurements is performed over the multiple frequencies and the multiple amplitudes of the output signal, the external signal having the same frequency as the output signal for each measurement of the second set of measurements; and determining a set of coefficients describing the operating characteristics of the signal generator by processing results of the first and second sets of measurements through a non-linear model.

In another representative embodiment, a measuring device for determining operating characteristics of a device under test (DUT) includes a test port, a signal source, a first receiver, a second receiver, and a processing unit. The test port is configured to connect to an output port of the DUT for inputting an output signal generated by the DUT and outputting a reflected signal corresponding to the output signal. The signal source is configured to generate an external signal selectively applied to the output port of the DUT. The first receiver is configured to perform a first set of output signal measurements of the output signal generated by the signal generator via a first coupler with no external signal applied to the output port of the DUT, and configured to perform a second set of output signal measurements via the first coupler with the external signal applied to the output port of the DUT. The second receiver is configured to perform a first set of reflected signal measurements of the reflected signal via a second coupler with no external signal applied to the output port of the DUT, and configured to perform a second set of reflected signal measurements via the second coupler with the external signal applied to the output port of the DUT. The processing unit is configured to determine a set of coefficients describing the operating characteristics of the signal generator by processing results of the first and second sets of output signal measurements and reflected signal measurements through a non-linear model. The first and second sets of output signal measurements and reflected signal measurements are performed over multiple frequencies and multiple amplitudes of the output signal, the external signal having the same frequency as the output signal for each measurement of the second sets of output signal and reflected signal measurements.

BRIEF DESCRIPTION OF THE DRAWINGS

The representative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Various representative embodiments generally provide a method for accurately characterizing behavior of a signal generator, such as a radio frequency (RF)/microwatt (µW) signal generator. The method may be implemented by a tuned-receiver Vector Network Analyzer (VNA) using absolute VNA receiver error correction, and non-linear measurement and modeling. The absolute VNA receiver error correction provides accurate measurements of absolute amplitude (or power) and phase of signals present on the VNA receivers.

Generally, a signal source external to the signal generator (external source) applies a signal to an output port of the signal generator, utilizing varying amplitude and phase states of the external source, while the signal generator is generating an output signal. For purposes of illustration, it may be assumed that the external source is a signal source internal to the VNA, although other external sources may be incorporated without departing form the scope of the present teachings. The applied VNA signal has the same frequenc(ies) as the output signal generated by the signal generator (as set by the signal generator). Various amplitude and phase states of the external source are set relative to the output signal of the signal generator. The states of the generated output signal may be set in frequency, amplitude, phase, and other settable characteristics. The VNA receivers measure the resulting forward and reverse signals at the various states of the signal generator and external source. The resulting signal data is then processed through a non-linear model resulting in non-linear describing coefficients of the signal generator at the various signal generator output signal states.

The non-linear model and signal generator coefficients may be used to perform various tasks. For example, behavior of the signal generator in a particular environment may be simulated using the generated coefficients of the non-linear model. The non-linear measurements enable the ability to distinguish the coefficients, one of which is output impedance, so the signal generator output impedance may be determined while it is generating the output signal. The RF output amplitude of the signal generator may be determined at a predefined terminating impedance, and output signal response versus input signal response of the signal generator may be determined in amplitude and phase. The VNA tuned-receivers are able to distinguish between fundamental frequency and distortion, resulting in a more accurate representation of the signal generator behavior. The VNA tuned-receivers also enable the ability to accurately measure the phase of the output signal.

Figure 1:
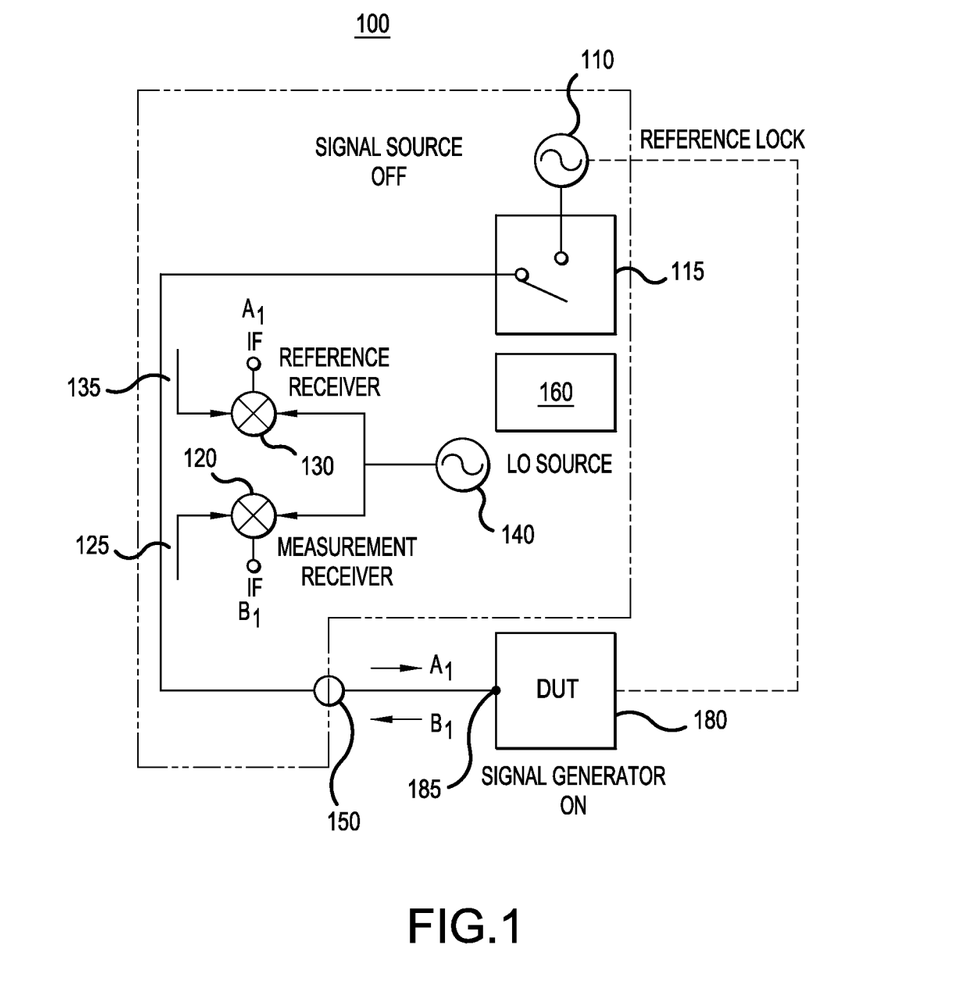
FIG. 1 is a simplified block diagram of a measuring device for determining operating characteristics of a device under test (DUT), according to a representative embodiment.
Figure 2:
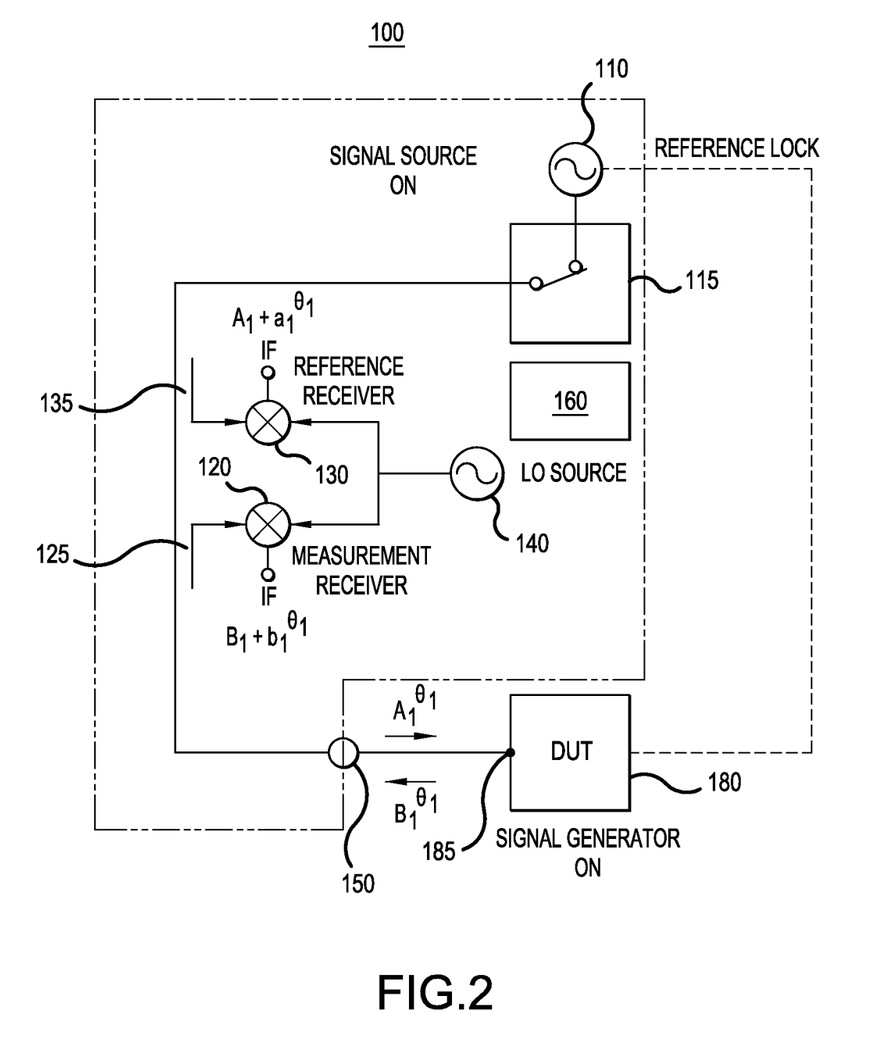
FIG. 2 is a simplified block diagram of the measuring device for determining operating characteristics of the DUT, according to a representative embodiment.

FIGS. 1 and 2 are simplified block diagrams of a measuring device for determining operating characteristics of a device under test (DUT), according to a representative embodiment. For example, the measuring device may be configured to measure frequency, amplitude and phase of signals generated by the DUT. The data resulting from these determinations may then be used to identify a non-linear model corresponding to the operating characteristics of the DUT, which enables determination of output amplitude and phase of signals generated by the DUT over varying conditions, such as output match, output power into known impedance, and the like.

More particularly, in the depicted embodiment, measuring device 100 determines operating characteristics of DUT 180, which may be a signal generator, having an output port 185. The measuring device 100 includes an internal signal source 110 and switch 115 for turning the signal source 110 on and off, although the signal source 110 and/or the switch 115 may be outside the measuring device 100, without departing from the scope of the present teachings. The signal source 110 may be an RF signal source, for example, and may be reference (frequency) locked to the DUT 180. The measuring device 100 further includes a first receiver 120, which may be used as a measurement receiver, and a second receiver 130, which may be used as a reference receiver, for example. Each of the first and second receivers 120 and 130 receive a local oscillator (LO) signal from LO source 140, which may also be reference locked to the signal source 110 and the DUT 180.

The measuring device 100 also includes test port 150, which inputs an output signal (vector) $B_1$ generated by the DUT 180 at fundamental frequency, and outputs a reflected signal (vector) $A_1$, corresponding to the output signal $B_1$, at the output port 185 of the DUT 180, where the subscript "1" refers to the port at which the signals are measured (output port 185). As discussed below, the first receiver 120 mixes the LO signal with the output signal $B_1$ received via first coupler 125 and the second receiver 130 mixes the LO signal with the reflected signal $A_1$ received via second coupler 135 to down-convert and measure the output signal $B_1$ and the reflected signal $A_1$, respectively.

A processing unit 160 is configured to control operations of the measuring device 100, and may be included in the measurement device 100 or may be a separate device, such as a personal computer (PC). The processing unit 160 is connected to one or more of the components of the measuring device 100, such as the switch 115, the first and second receivers 120 and 130, the first and second couplers 125 and 135, and the LO source 140, for controlling various aspects of measuring signals and characterizing the DUT 180, including execution of various steps depicted in FIG. 3, discussed below. Although no specific connections to the processing unit 160 are shown in FIGS. 1 and 2 for the sake of convenience, it is understood that any type of wired and/or wireless connections between the processing unit 160 and components of the measuring device 100, enabling transmission of communication and control signals, may be incorporated without departing from the scope of the present teachings.

Generally, the processing unit 160 may be implemented by a computer processor (e.g., of a PC or dedicated workstation), application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include memory (e.g., volatile and/or nonvolatile memory) for storing executable software/firmware executable code that allows it to perform the various functions. In an embodiment, the computer processor may comprise a central processing unit (CPU), for example, executing an operating system. The processing unit 160 may include a storage device, such as random access memory (RAM), read-only memory (ROM), flash memory, electrically programmable ROM (EPROM), electrically erasable programmable ROM (EEPROM), hard disk drive (HDD), or the like. Data from various measurements and characterizations of the DUT 180 may be displayed and/or stored for analysis, for example. A user interface, such as a graphical user interface (GUI) may be included with the processing unit 160 for a user to control operations and/or view data and computation results of the measurement device 100.

In an embodiment, the measuring device 100 may be a vector network analyzer (VNA), for example, such as an N523xA PNA-L Series or N524xA PNA-X Series VNA, available from Agilent Technologies, Inc., although other types of measuring devices (or measuring systems) may be incorporated without departing from the scope of the present teachings.

The measuring device 100 provides two configurations for performing measurements to determine the operating characteristics of the DUT 180. In the first configuration, shown in FIG. 1, the signal source 110 of the measuring device 100 is "off" (the switch 115 is open). In the second configuration, shown in FIG. 2, the signal source 110 is "on" (the switch 115 is closed), such that a (RF) signal generated by the signal source 110 is applied to the DUT 180 via the test port 150 while measurements are performed. Notably, calibration is performed on the measuring device 100 before performing the measurements on the DUT 180 in order to remove systematic measurement errors. The calibration effectively creates a measurement plane at the DUT 180 interface, for example, at the output port 185 of the DUT 180 (e.g., usually at the end of a cable connecting the measuring device 100 and the DUT 180). The calibration and subsequent error correction ensure that only the DUT 180 is being measured.

Referring to FIG. 1, the measuring device 100 performs a first set of measurements of the output signal $B_1$ generated by the DUT 180 and a corresponding reflected signal $A_1$ at the output port 185 of the DUT 180 (calibrated measurement plane) with no signal from the signal source 110. The first set of measurements is performed over multiple frequencies and multiple amplitudes of the output signal $B_1$ required of the DUT 180. In an embodiment, the frequencies and amplitudes of the output signal $B_1$ are set by the DUT 180, not by the measuring device 100. The output signal $B_1$ is measured by being coupled to the first receiver 120 (measurement receiver) by the first coupler 125, where the coupled signal $B_1$ is mixed with the LO signal to provide an intermediate frequency (IF) signal for measuring the output signal $B_1$. The reflected signal $A_1$ is measured by being coupled to the second receiver 130 (reference receiver) by the second coupler 135, where the coupled signal $A_1$ is mixed with the LO signal to provide an IF signal for measuring the reflected signal $A_1$.

Referring to FIG. 2, the signal source 110 of the measuring device 100 applies a signal (which may be referred to as "external signal") to the output port of the DUT 180 via the test port 150, where the external signal is generated by the signal source 110, although the external signal may be provided from another signal source external to the DUT 180 without departing from the scope of the present teachings. The measuring device 100 performs a second set of measurements of the output signal (vector) $B_1^{\Theta 1}$ at the output port 185, where the output signal $B_1^{\Theta 1}$ is the sum of the output signal $B_1$, which is generated by the DUT 180, and output signal (vector) $b_1^{\Theta 1}$, which provides a portion of the output signal influenced by the application of the external signal. Therefore, $B_1^{\Theta 1}=B_1+b_1^{\Theta 1}$. The measuring device 100 also performs a second set of measurements of the reflected signal (vector) $A_1^{\Theta 1}$, corresponding to the output signal $B_1^{\Theta 1}$, at the output port 185, where the reflected signal $A_1^{\Theta 1}$ is the sum of the reflected signal $A_1$, which is reflected at the output port 185, and reflected signal (vector) $a_1^{\Theta 1}$, which provides a portion of the reflected signal influenced by the application of the external signal. Therefore, $A_1^{\Theta 1}=A_1+a_1^{\Theta 1}$. The second set of measurements is performed over the same frequencies and amplitudes of the output signal $B_1$ used for the first set of measurements, where the external signal has the same frequency as the output signal $B_1^{\Theta 1}$ for each measurement of the second set of measurements. Also, the external signal is applied to the output port 185 of the DUT 180 at a frequency over a number of phase states. The phase of the signal source 110 may be set to $\theta_n$ in relation to the DUT 180. The measurements are repeated over "n" phase states, so that the phase is rotated over 360 degrees. For example, in an embodiment, there may be four measurements of each of the output signal $B_1^{\Theta 1}$ to $B_1^{\Theta 4}$ and the reflected signal $A_1^{\Theta 1}$ to $A_1^{\Theta 4}$ at four different phases (e.g., 90°, 180°, 270° and 360°).

The output signal $B_1^{\Theta 1}$ is measured by coupling the output signal $B_1^{\Theta 1}$ to the first receiver 120 by the first coupler 125, where the coupled output signal $B_1^{\Theta 1}$ is mixed with the LO signal to provide an IF signal for measuring the output signal $B_1^{\Theta 1}$. The reflected signal $A_1^{\Theta 1}$ is measured by coupling the reflected signal $A_1^{\Theta 1}$ to the second receiver 130 by the second coupler 135, where the coupled reflected signal $A_1^{\Theta 1}$ is mixed with the LO signal to provide an IF signal for measuring the reflected signal $A_1^{\Theta 1}$. The output signal $b_1^{\Theta 1}$ indicating the portion of the output signal influenced by application of the external signal may be determined by subtracting measured output signal $B_1$ from measured output signal $B_1^{\Theta 1}$, and the output signal $a_1^{\Theta 1}$ indicating the portion of the reflected signal influenced by application of the external signal may be determined by subtracting measured reflected signal $A_1$ from measured reflected signal $A_1^{\Theta 1}$. A set of coefficients describing operating characteristics of the DUT 180 is determined by processing results of the first and second sets of measurements through a non-linear model, discussed below.

The signal source 110 should be set to $B_{1max}$-$\psi$, where $B_{1max}$ is the maximum expected output amplitude (or power) from the DUT 180, and $\psi$ is set to a value that ensures that the linearity constraint for this small signal response is not violated. Generally, $\psi$ may be about 16 dBc, for example, although $\psi$ may be set to other values, for example, depending on the internal hardware configuration of the DUT 180. In some cases the value of the signal source 110 must be set to dynamically track output amplitude of the DUT 180, as in $B_1$-$\psi$, to ensure the linearity constraint. As mentioned above, this measurement is performed over the specific $B_1$ amplitudes and frequencies required of the DUT 180.

After performing the first set of measurements and the second set of measurements (e.g., at four different phases), the data gathered pursuant to these five measurement sets are phase normalized to the phases of the output signals $B_1$ before determining coefficients (e.g., X-parameter coefficients) of the non-linear model, provided by Equation (4) discussed below. That is, phase normalization is performed by taking measurements of each output signal $B_1$ and $B_1^{\Theta n}$, and corresponding reflected signal $A_1$ and $A_1^{\Theta n}$ to provide data sets, and phase rotating each data set by the phase of the output signal $B_1$ (from the first set of measurements. The phase normalized output and reflected signals become $\overline{B_1}$, $\overline{B_1^{\Theta n}}$, $\overline{A_1}$, and $\overline{A_1^{\Theta n}}$, respectively, as discussed further below.

The measurement equations for DUT 180 (e.g., assuming for purpose of illustration that the DUT 180 is a signal generator) require a measurement of the match of the DUT 180, and the effects of that match on the output amplitude while the DUT 180 is in a stimulus condition (e.g., which may be referred to as "hot" match). This may be accomplished using X-parameter equations, measurements and derivations, discussed below with reference to Equations (1) to (4). This method also provides direct measurement of the output amplitude from the DUT 180.

As an initial matter, the measured values of the output signals $\overline{B_1}$, $\overline{B_1^{\Theta n}}$ and corresponding reflected signals $\overline{A_1}$, $\overline{A_1^{\Theta n}}$ are error corrected to obtain actual values of the same. Assuming for purposes of illustration that the measurement device 100 is a VNA, standard calibration may be performed to gather the necessary error terms for measuring vector corrected signals. The actual signals $\overline{A_1}$, $\overline{A_1^{\Theta n}}$ and $\overline{B_1}$, $\overline{B_1^{\Theta n}}$ are modified by the systematic errors of the VNA, determined during calibration, as measured signals $\overline{A_1}$, $\overline{A_1^{\Theta n}}$ and $\overline{B_1}$, $\overline{B_1^{\Theta n}}$.

In a general sense, for all A and B signals in all measurement sets, the uncorrected measured signals $A_u$ and $B_u$ may be error corrected using the error terms obtained through calibration to provide the corrected measured signals $A_c$ and $B_c$ according to Equation (1) below.

$$\begin{bmatrix} A_c \\ B_c \end{bmatrix} = \frac{1}{e_{10}} \begin{bmatrix} e_{10}e_{01} - e_{00}e_{11} & e_{11} \\ -e_{00} & 1 \end{bmatrix} \begin{bmatrix} A_u \\ B_u \end{bmatrix} \quad (1)$$

In Equation (1), $e_{00}$ is linear systematic directivity error Ed, $e_{11}$ is linear systematic source match error Es, $e_{10}e_{01}$ is linear systematic reflection tracking error Er, and $e_{01}$ is the linear systematic receiver tracking error of the measurement device 100.

Phase normalized small signals $\overline{b_1^{\Theta n}}$ and $\overline{a_1^{\Theta n}}$ may then be obtained by subtracting the phase normalized large signal components, as shown in Equations (2) and (3), where $\overline{B_1^{\Theta n}}$ is the phase normalized output signal $\overline{B_1^{\Theta n}}$ and $\overline{A_1^{\Theta n}}$ is the phase normalized reflected signal $A_1^{\Theta n}$.

$$\overline{b_1^{\Theta n}} = \overline{B_1^{\Theta n}} - \overline{B_1} \quad (2)$$

$$\overline{a_1^{\Theta n}} = \overline{A_1^{\Theta n}} - \overline{A_1} \quad (3)$$

A set of X-parameter coefficients describing operating characteristics of the DUT 180 may then be generated by processing the results of the first and second sets of (phase normalized) measurements through a non-linear model, indicated by generic X-parameter equation shown in Equation (4):

$$b_1 = X_{1\_LSOP_n}^F + X_{11\_LSOP_n}^S \cdot a_1 + X_{11\_LSOP_n}^T \cdot p^2 \cdot a_1^* \quad (4)$$

More particularly, Equation (4) is a one-port X-parameter equation that relates incident to reflected signals through the X-parameter coefficients. In Equation (4), the X-parameter coefficients $X_{1\_LSOP_n}^F$, $X_{11\_LSOP_n}^S$, and $X_{11\_LSOP_n}^T$ are valid for a specific large signal operating point (LSOP) set by the DUT 180 itself (the value of the frequency, amplitude and phase of the DUT 180 output signal $B_1$). $X_{1\_LSOP_n}^F$ indicates simpler non-linear input and output signal mapping, $X_{11\_LSOP_n}^S$ indicates linearized mapping of the input signal to the output signal, and $X_{11\_LSOP_n}^T$ indicates linearized mapping of a conjugated input signal to the output signal. P is the phase $e^{j\Theta(B_1)}$ of the output signal $B_1$ that results from phase normalization to get the X-parameter solution in terms of the applied $|B_1|$. Since the measured signals will be phase normalized to $\overline{B1}$ before extracting the X-parameters, the P term is one. The phase of $B_1$ is zero degrees, therefore $e^{j0}=1$. Examples of extracting X-parameter coefficients are provided by U.S. Pat. No. 7,671,605, to Gunyan et al. (Mar. 2, 2010), which is hereby incorporated by reference in its entirety.

The subscript "11" in $X_{11\_LSOP_n}^S$ and $X_{11\_LSOP_n}^T$ has the same definition as S-parameters. That is, the first number corresponds to a receiver port (e.g., test port 150 or output port 185, which are effectively the same after calibration) and the second number corresponds to a stimulus port (e.g., also test port 150 or output port 185). The subscript "1" in $X_1^F$ (LSOP) is defined as the output port (e.g., output port 185), since $X_1^F$ (LSOP) is an un-ratioed quantity for the set LSOP.

The $X_{11\_LSOP_n}^S$ and $X_{11\_LSOP_n}^T$ X-parameter coefficients are determined by taking the phase normalized data and subtracting the first measurement set from each of the second measurement sets taken during phase rotation (e.g., four second measurement sets). This leaves the small signal responses shown in Equations (2) and (3), above, which were generated when stimulating the DUT 180 with the signal source 110. The $X_{1\_LSOP_n}^F$ X-parameter coefficient is dropped from the equation above because of the subtraction on the large signal responses $B_1$ and $A_1$. With the large signal, output signal $B_1$ removed and by substitution of variables from previous equations, the small signal equivalent of Equation (4) may be written as shown in Equations (5a) to (5c), where the superscript "*" denotes complex conjugate, and the $P^2$ term drops out since it has a value of 1 due to the phase normalization, discussed above.

$$\overline{b_1^{\theta_n}} = X_{11\_LSOP_n}{}^S \cdot \overline{a_1^{\theta_n}} + X_{11\_LSOP_n}{}^T \cdot (\overline{a_1^{\theta_n}})^* \quad (5a)$$

$$\begin{bmatrix} \overline{b_1^{\theta_0}} \\ \overline{b_1^{\theta_1}} \\ \overline{b_1^{\theta_2}} \\ \overline{b_1^{\theta_3}} \end{bmatrix} = \begin{bmatrix} \overline{a_1^{\theta_0}} & (\overline{a_1^{\theta_0}})^* \\ \overline{a_1^{\theta_1}} & (\overline{a_1^{\theta_1}})^* \\ \overline{a_1^{\theta_2}} & (\overline{a_1^{\theta_2}})^* \\ \overline{a_1^{\theta_3}} & (\overline{a_1^{\theta_3}})^* \end{bmatrix} \cdot \begin{bmatrix} X_{11}^S \\ X_{11}^T \end{bmatrix} \quad (5b)$$

Let $\theta_{i=0,1,2,3} = 0°, 90°, 180°, 270°$:

$$\begin{bmatrix} \overline{b_1^{\theta_0}} \\ \overline{b_1^{\frac{\theta_\pi}{2}}} \\ \overline{b_1^{\theta_\pi}} \\ \overline{b_1^{\frac{\theta_{3\pi}}{2}}} \end{bmatrix} = \begin{bmatrix} \overline{a_1^{\theta_0}} & (\overline{a_1^{\theta_0}})^* \\ \overline{a_1^{\frac{\theta_\pi}{2}}} & (\overline{a_1^{\frac{\theta_\pi}{2}}})^* \\ \overline{a_1^{\theta_\pi}} & (\overline{a_1^{\theta_\pi}})^* \\ \overline{a_1^{\frac{\theta_{3\pi}}{2}}} & (\overline{a_1^{\frac{\theta_{3\pi}}{2}}})^* \end{bmatrix} \cdot \begin{bmatrix} X_{11}^S \\ X_{11}^T \end{bmatrix} \xrightarrow{yields} [b] = [a][X] \quad (5c)$$

In Equation (5c), [b] is an m×1 matrix, [a] is an m×n matrix, and [X] is an n×1 matrix, where m and n are positive integers. The $X_{1\_LSOP_n}{}^F$ X-parameter coefficient is determined from the non-linear model (Equation (4)), using the solution for $X_{11\_LSOP_n}{}^S$ and $X_{11\_LSOP_n}{}^T$ and the phase normalized data from the first set of measurements, as shown in Equation (6).

$$X_{1\_LSOP_n}{}^F = \overline{B_1} - X_{11\_LSOP_n}{}^S \cdot \overline{A_1} - X_{11\_LSOP_n}{}^T \cdot \overline{A_1}^* \quad (6)$$

The X-parameter coefficients may then be analyzed. For example, the contribution of normalized reflected and output signals $\overline{A_1}$ on $\overline{B_1}$ is contained in $\Delta \overline{B_1}$, and may be defined as shown in Equation (7).

$$\Delta \overline{B_1} = X_{11\_LSOP_n}{}^S \cdot \overline{A_1} + X_{11\_LSOP_n}{}^T \cdot \overline{A_1}^* \quad (7)$$

Based on the calculated X-parameter coefficients and phase normalized data from the first set of measurements, Equation (8) may be used to determine the source match of the DUT 180.

$$\Gamma_{11}^S = \frac{\Delta \overline{B_1}}{\overline{A_1}} = X_{11\_LSOP_n}^S + X_{11\_LSOP_n}^T \cdot \frac{\overline{A_1}^*}{\overline{A_1}} \quad (8)$$

The match corrected output amplitude may be interpreted as follows. If output amplitude is defined as the DUT 180 being matched to calibrated system impedance, then because it is a matched system, $\overline{A_1} = 0$. The output amplitude therefore becomes $\overline{B_1}$ as shown in Equation (9).

$$\overline{B_1} = X_{1\_LSOP_n}{}^F \quad (9)$$

Figure 3:
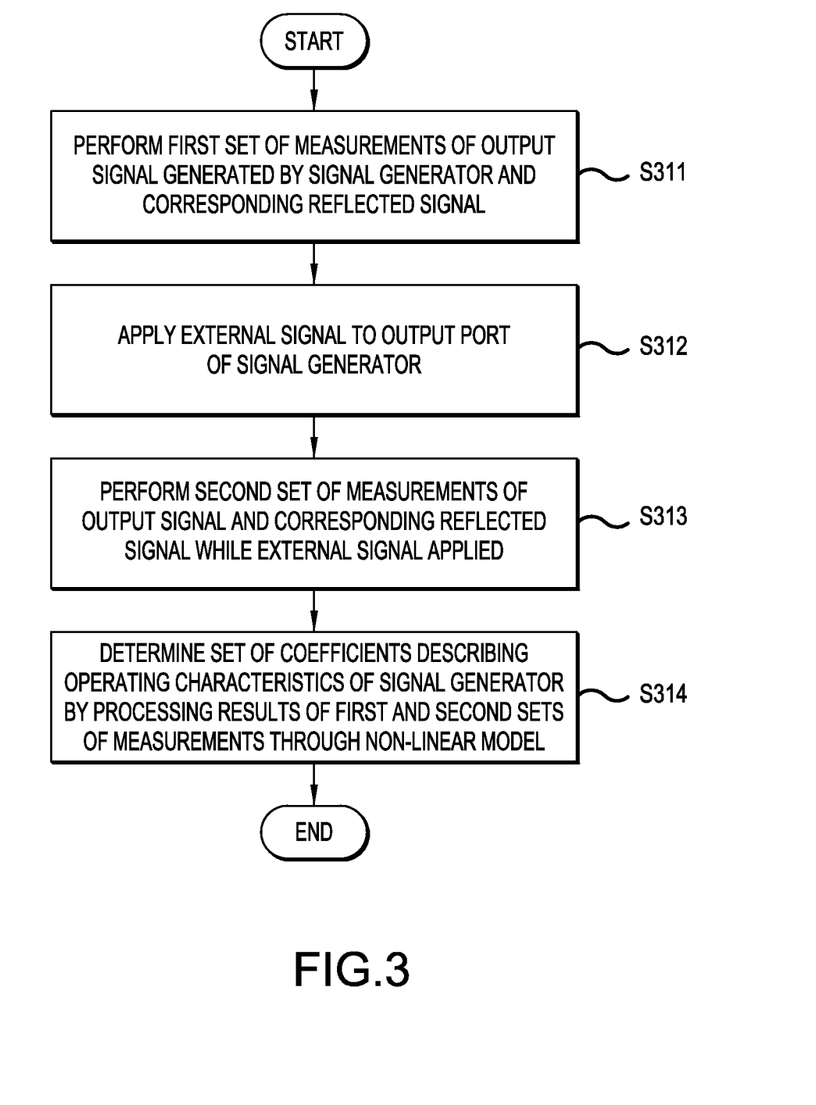
FIG. 3 is a flow diagram showing a method of determining operating characteristics of a DUT using a non-linear model, according to a representative embodiment.

FIG. 3 is a flow diagram showing a method of determining operating characteristics of a DUT using a non-linear model, according to a representative embodiment.

For purposes of illustration, the DUT (e.g., DUT 180) is assumed to be a signal generator, although the method may apply to other types of DUTs without departing from the scope of the present teachings. Also, all or part of the steps or operations shown in FIG. 3 may be executed by a processing unit (e.g., processing unit 160) and/or a VNA, for example, which includes at least one test port (e.g., test port 150) connectable to an output port (e.g., output port 185) of the signal generator for receiving generated signals, tuned receivers (e.g., first and second receivers 120 and 130) for receiving and measuring output and reflected signals, respectively, and a signal source (e.g., signal source 110) for generating an external RF stimulus signal applied to the output port of the signal generator. The processing unit may be included in the VNA or may be a separate device, such as a PC, as mentioned above.

Referring to FIG. 3, the method includes performing a first set of measurements of an output signal generated by the signal generator and a corresponding reflected signal at an output port of the signal generator at block S311. The first set of measurements is performed over multiple frequencies and multiple amplitudes of the output signal, and the LSOP is set by the DUT 180 itself (the value of the frequency, amplitude and phase of the output signal).

In block S312, an external signal is applied to the output port of the signal generator. The external signal may be an RF signal applied by a signal source internal to the VNA, for example. A second set of measurements of the output signal and the corresponding reflected signal is performed at the output port of the signal generator at block S313, while the external signal is being applied to the output port. The second set of measurements is performed over the same multiple frequencies and amplitudes of the output signal, and the external signal has the same frequency as the output signal for each measurement of the second set of measurements.

The external signal may be set to an expected maximum amplitude of the multiple amplitudes of the output signal, less a predetermined constant to ensure that a linearity constraint for small signal response is not violated. Also, the phase state of the external signal may be rotated over 360 degrees in relation to the phase of the output signal during the second set of measurements. For example, the second set of measurements may include measurements of the output signal while applying the external signal at phases of 90 degrees, 180 degrees, 270 degrees and 360 degrees for each frequency.

In block S314, a set of coefficients describing the operating characteristics of the signal generator is determined by processing results of the first and second sets of measurements through a non-linear model, such as the non-linear model shown in Equation (4), above. The method may further include reference signal locking the signal source, e.g., of the VNA and the signal generator for performing the first and second sets of measurements.

The set of coefficients may be valid for a specific large signal operating point (LSOP) of the output signal generated by the signal generator, and may describe a complete non-linear input and output signal mapping. For example, the coefficients may be X-parameter coefficients, where a first coefficient (e.g., $X_{1\_LSOP_n}{}^F$) describes simpler non-linear input and output signal mapping, and a set of two coefficients describes linearized input and output signal mapping. The set of two coefficients includes, for example, a second coefficient (e.g., $X_{11\_LSOP_n}{}^S$) for linearized mapping of the input signal to the output signal, and a third coefficient (e.g., $X_{11\_LSOP_n}{}^T$) for linearized mapping of a conjugated input signal to the output signal. According to an embodiment, as provided by Equation (4), the non-linear model generally includes the output signal of the signal generator at an output port being equal to the first coefficient, plus the product of the second coefficient and the reflected signal corresponding to the output signal at the output port, plus the product of the third coefficient, the conjugate of the reflected signal corresponding to the output signal at the output port, and the square of the phase of the output signal resulting from phase normalization.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A method of determining operating characteristics of a signal generator by a measuring device, the method comprising:
performing a first set of measurements of an output signal generated by the signal generator and a corresponding reflected signal at an output port of the signal generator, while no external signal is being applied to the output port, wherein the first set of measurements is performed over a plurality of frequencies and a plurality of amplitudes of the output signal;
applying an external signal to the output port of the signal generator;
performing a second set of measurements of the output signal and the corresponding reflected signal at the output port of the signal generator while the external signal is being applied to the output port, wherein the second set of measurements is performed over the plurality of frequencies and the plurality of amplitudes of the output signal, the external signal having the same frequency as the output signal for each measurement of the second set of measurements; and
determining a set of coefficients describing the operating characteristics of the signal generator by processing results of the first and second sets of measurements through a non-linear model.

2. The method of claim 1, wherein the external signal applied to the output port of the signal generator is set to an expected maximum amplitude of the plurality of amplitudes of the output signal less a predetermined constant ensuring a linearity constraint for small signal response is not violated.

3. The method of claim 1, wherein the second set of measurements is performed over a plurality of phase states of the external signal relative to a phase of the output signal for each frequency.

4. The method of claim 3, wherein the phase state of the external signal is rotated over 360 degrees in relation to the phase of the output signal.

5. The method of claim 4, wherein the second set of measurements comprises measurements of the output signal while applying the external signal to the output port at phases of 90 degrees, 180 degrees, 270 degrees and 360 degrees for each frequency.

6. The method of claim 1, wherein the measuring device comprises a vector network analyzer (VNA) comprising a test port, a tuned receiver and an internal signal source.

7. The method of claim 6, wherein the first and second sets of measurements are performed by the tuned receiver configured to receive the output signal generator by the signal generator via the test port, and the external signal applied to the output port of the signal generator is generated by the signal source of the VNA.

8. The method of claim 7, further comprising:
reference signal locking the signal source of the VNA and the signal generator for performing the first and second sets of measurements.

9. The method of claim 1, wherein the set of coefficients is valid for a specific large signal operating point of the output signal, the large signal operating point being set by the signal generator.

10. The method of claim 9, wherein the set of coefficients describe complete non-linear input and output signal mapping.

11. The method of claim 9, wherein the set of coefficients comprises:
a first coefficient that describes simpler non-linear input and output signal mapping; and
a set of two coefficients that describes linearized input and output signal mapping, wherein the set of two coefficients comprises:
a second coefficient for linearized mapping of the input signal to the output signal, and
a third coefficient for linearized mapping of a conjugated input signal to the output signal.

12. The method of claim 11, wherein the non-linear model comprises the output signal at the output port of the signal generator being equal to the first coefficient, plus the product of the second coefficient and the reflected signal corresponding to the output signal at the output port, plus the product of the third coefficient, the conjugate of the reflected signal corresponding to the output signal at the output port, and the square of the phase of the output signal resulting from phase normalization.

13. A measuring device for determining operating characteristics of a device under test (DUT), the device comprising:
a test port configured to connect to an output port of the DUT for inputting an output signal generated by the DUT and output at the output port, and for outputting a reflected signal corresponding to the output signal;
a signal source configured to generate an external signal selectively applied to the output port of the DUT;
a first receiver configured to perform a first set of output signal measurements of the output signal generated by the DUT via a first coupler with no external signal applied to the output port of the DUT, and configured to perform a second set of output signal measurements of the output signal via the first coupler with the external signal applied to the output port of the DUT;
a second receiver configured to perform a first set of reflected signal measurements of the reflected signal via a second coupler with no external signal applied to the output port of the DUT, and configured to perform a second set of reflected signal measurements of the reflected signal via the second coupler with the external signal applied to the output port of the DUT;
a processing unit configured to determine a set of coefficients describing the operating characteristics of the DUT by processing results of the first and second sets of output signal measurements and reflected signal measurements through a non-linear model,
wherein the first and second sets of output signal measurements and reflected signal measurements are performed over a plurality of frequencies and a plurality of amplitudes of the output signal, the external signal having the same frequency as the output signal for each measurement of the second sets of output signal and reflected signal measurements.

14. The device of claim 13, wherein the first and second receivers perform the second set of output signal measurements and reflected signal measurements, respectively, over a plurality of phase states of the external signal relative to a phase of the output signal for each frequency during the first set of output signal measurements.

15. The device of claim 14, wherein the phase state of the external signal is rotated over 360 degrees in relation to the phase of the output signal during the first set of output signal measurements.

16. The device of claim 15, wherein the first receiver performs the second set of output signal measurements while the signal source applies the external signal at phases of 90 degrees, 180 degrees, 270 degrees and 360 degrees for each frequency.

17. The device of claim 13, wherein the set of coefficients comprises:
   a first coefficient that describes simpler non-linear input and output signal mapping; and
   a set of two coefficients that describes linearized input and output signal mapping, wherein the set of two coefficients comprises:
      a second coefficient for linearized mapping of the input signal to the output signal, and
      a third coefficient for linearized mapping of a conjugated input signal to the output signal.

18. The device of claim 17, wherein the non-linear model comprises the output signal at the output port of the DUT being equal to the first coefficient, plus the product of the second coefficient and the reflected signal corresponding to the output signal at the output port, plus the product of the third coefficient, the conjugate of the reflected signal corresponding to the output signal at the output port, and the square of the phase of the output signal resulting from phase normalization.

19. The device of claim 17, wherein each of the first, second and third coefficients comprises an X-parameter coefficient valid for a specific large signal operating point of the output signal.

20. A measuring device for determining operating characteristics of a signal generator configured to generate an output signal, the device comprising:
   a measurement receiver configured to perform a first set of output signal measurements of the output signal generated by the signal generator with no external signal applied to the output port of the signal generator, and configured to perform a second set of output signal measurements with an external signal applied to the output port of the signal generator;
   a reference receiver configured to perform a first set of reflected signal measurements of a reflected signal corresponding the output signal with no external signal applied to the output port of the signal generator, and configured to perform a second set of reflected signal measurements with the external signal applied to the output port of the signal generator; and
   a processing unit configured to determine a set of coefficients describing the operating characteristics of the signal generator by processing results of the first and second sets of output signal measurements and reflected signal measurements through a non-linear model,
   wherein the first and second sets of output signal measurements and reflected signal measurements are performed over a plurality of frequencies and a plurality of amplitudes of the output signal, the external signal having the same frequency as the output signal for each measurement of the second sets of output signal and reflected signal measurements, and
   wherein the measurement and reference receivers perform the second set of output signal measurements and reflected signal measurements, respectively, over a plurality of phase states of the external signal relative to a phase of the output signal for each frequency during the first set of output signal measurements.

* * * * *